United States Patent
Ahn et al.

(10) Patent No.: US 6,603,411 B2
(45) Date of Patent: Aug. 5, 2003

(54) METHOD FOR MODULATING DIGITAL DATA AND APPARATUS THEREFOR

(75) Inventors: Seong Keun Ahn, Seoul (KR); Sang Woon Suh, Seoul (KR); Kees A. Schouhammer Immink, Geldrop (NL)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/955,103

(22) Filed: Sep. 19, 2001

(65) Prior Publication Data

US 2002/0167425 A1 Nov. 14, 2002

(30) Foreign Application Priority Data

Mar. 24, 2001 (KR) ......................................... 2001/15445

(51) Int. Cl.$^7$ ............................................... H03M 5/00
(52) U.S. Cl. ........................................... 341/58; 341/53
(58) Field of Search ............................. 341/53, 58, 59; 714/759, 752; 369/59.25

(56) References Cited

U.S. PATENT DOCUMENTS

| | | | | |
|---|---|---|---|---|
| 5,212,695 A | * | 5/1993 | Shikakura et al. | 714/759 |
| 5,587,991 A | * | 12/1996 | Nabeshima et al. | 369/59.25 |
| 5,682,153 A | * | 10/1997 | Ishiguro | 341/53 |
| 5,917,857 A | * | 6/1999 | Tanaka et al. | 341/59 |
| 6,044,053 A | * | 3/2000 | Ido | 341/58 |
| 6,079,041 A | * | 6/2000 | Kunisa et al. | 714/752 |

* cited by examiner

Primary Examiner—Jean Bruner JeanGlaude
(74) Attorney, Agent, or Firm—Birch, Stewart, Kolasch & Birch, LLP (57) ABSTRACT

A method for modulating digital data and apparatus therefor is capable of determining a digital data stream coded by Run Length Limited swiftly and precisely so as to record data in a recording medium. The digital data modulating method includes the steps of comparing a preset critical value and DSV (Digital Sum Value) of a certain digital data stream, computing the penalty of the digital data stream by multiplying the number of the time that the DSV of the digital data stream is larger than the critical value by a preset weight value of the critical value, comparing the penalty of the digital data and a penalty of another digital data stream and selecting a digital data stream with a smaller penalty as the digital data stream. Therefore, with the method for modulating digital data and apparatus therefor, the digital data stream which will be modulated among a number of digital data streams can be selected precisely and swiftly.

22 Claims, 11 Drawing Sheets

FIG. 1A
PRIOR ART

| DIGITAL DATA STREAM1 | 1 | 0 | 0 | 1 | 1 | 0 | 0 | 0 | 1 | 1 | 1 | 1 | 1 | 0 | 0 | 1 | 1 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|---|---|---|---|---|---|---|---|---|---|---|---|---|---|---|
| BIPOLAR CODE | +1 | -1 | -1 | +1 | +1 | -1 | -1 | -1 | +1 | +1 | +1 | +1 | +1 | -1 | -1 | +1 | +1 | -1 | -1 | -1 | -1 | -1 | -1 | -1 | +1 | +1 | +1 | +1 | +1 | +1 | +1 | +1 |
| BITS DSV | 1 | 0 | -1 | 0 | 1 | 0 | -1 | -2 | -1 | 0 | 1 | 2 | 3 | 2 | 1 | 2 | 3 | 2 | 1 | 0 | -1 | -2 | -3 | -4 | -3 | -2 | -1 | 0 | 1 | 2 | 3 | 4 |
| BYTES DSV |   |   |   |   |   |   |   | -2 |   |   |   |   |   |   |   | 2 |   |   |   |   |   |   |   | -4 |   |   |   |   |   |   |   | 4 |
| \|DSV\| | 1 | 0 | 1 | 0 | 1 | 0 | 1 | 2 | 1 | 0 | 1 | 2 | 3 | 2 | 1 | 2 | 3 | 2 | 1 | 0 | 1 | 2 | 3 | 4 | 3 | 2 | 1 | 0 | 1 | 2 | 3 | 4 |
| (DSV)$^2$ | 1 | 0 | 1 | 0 | 1 | 0 | 1 | 4 | 1 | 0 | 1 | 4 | 9 | 4 | 1 | 4 | 9 | 4 | 1 | 0 | 1 | 2 | 9 | 16 | 9 | 4 | 1 | 0 | 1 | 4 | 9 | 16 |

FIG. 1B
PRIOR ART

| DIGITAL DATA STREAM2 | 1 | 0 | 0 | 1 | 1 | 0 | 0 | 0 | 1 | 1 | 1 | 1 | 1 | 0 | 0 | 1 | 1 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|---|---|---|---|---|---|---|---|---|---|---|---|---|---|---|
| BIPOLAR CODE | +1 | -1 | -1 | +1 | +1 | -1 | -1 | -1 | +1 | +1 | +1 | +1 | +1 | -1 | -1 | +1 | +1 | -1 | -1 | -1 | -1 | -1 | -1 | -1 | +1 | +1 | +1 | +1 | +1 | +1 | +1 | +1 |
| BITS DSV | 1 | 0 | -1 | 0 | 1 | 0 | -1 | -2 | -1 | 0 | 1 | 2 | 3 | 2 | 1 | 2 | 3 | 2 | 1 | 0 | -1 | -2 | -3 | -4 | -3 | -2 | -1 | 0 | 1 | 0 | -1 | 0 |
| BYTES DSV |   |   |   |   |   |   |   | -2 |   |   |   |   |   |   |   | 2 |   |   |   |   |   |   |   | -4 |   |   |   |   |   |   |   | 0 |
| \|DSV\| | 1 | 0 | 1 | 0 | 1 | 0 | 1 | 2 | 1 | 0 | 1 | 2 | 3 | 2 | 1 | 2 | 3 | 2 | 1 | 0 | 1 | 2 | 3 | 4 | 3 | 2 | 1 | 0 | 1 | 0 | 1 | 0 |
| (DSV)$^2$ | 1 | 0 | 1 | 0 | 1 | 0 | 1 | 4 | 1 | 0 | 1 | 4 | 9 | 4 | 1 | 4 | 9 | 4 | 1 | 0 | 1 | 2 | 9 | 16 | 9 | 4 | 1 | 0 | 1 | 0 | 1 | 0 |

PRIOR ART

| DIGITAL DATA STREAM1 | 1 0 0 1 1 0 0 0 1 1 1 1 1 0 0 1 1 0 0 0 0 0 0 0 0 1 1 1 1 1 1 1 1 |
|---|---|
| BIPOLAR CODE | +1-1-1+1+1-1-1-1-1+1+1+1+1+1-1-1+1+1-1-1-1-1-1-1-1-1+1+1+1+1+1+1+1+1 |
| BITS DSV | 1 0 -1 0 1 0 -1 -2 -1 0 1 2 3 2 1 2 3 2 1 0 -1 -2 -3 -4 -3 -2 -1 0 1 2 3 4 |
| BYTES DSV | -2                2                -4                4 |

FIG. 5B

| DIGITAL DATA STREAM2 | 1 0 0 1 1 0 0 0 1 1 1 1 1 0 0 1 1 0 0 0 0 0 0 0 0 1 1 1 1 1 1 1 1 |
|---|---|
| BIPOLAR CODE | +1-1-1+1+1-1-1-1-1+1+1+1+1+1-1-1+1+1-1-1-1-1-1-1-1-1+1+1+1+1+1+1+1+1 |
| BITS DSV | 1 0 -1 0 1 0 -1 -2 -1 0 1 2 3 2 1 2 3 2 1 0 -1 -2 -3 -4 -3 -2 -1 0 1 0 1 0 -1 0 |
| BYTES DSV | -2                2                -4                0 |

| WEIGHT VALUE LEVEL | WEIGHT VALUE |
|---|---|
| $M_1 = |-M_1|$ | 1 |
| $M_2 = |-M_2|$ | 2 |
| $M_3 = |-M_3|$ | 4 |
| $M_4 = |-M_4|$ | 8 |

FIG. 8B

| WEIGHT VALUE LEVEL | WEIGHT VALUE |
|---|---|
| $M_1$ | 1 |
| $M_2$ | 2 |
| $M_3$ | 4 |
| ⋮ | ⋮ |
| $-M_1$ | 1 |
| $-M_2$ | 4 |
| $-M_3$ | 8 |
| ⋮ | ⋮ |

METHOD FOR MODULATING DIGITAL DATA AND APPARATUS THEREFOR

BACKGROUND OF THE INVENTION

1. Field of the Invention

The present invention relates to a method for modulating digital data and apparatus therefor and particularly, to a method for modulating digital data and apparatus therefor which determines digital data stream coded by Run Length Limited (hereinafter as RLL) swiftly and precisely so as to record data in a recording medium (also referred to herein as record medium).

2. Description of the Background Art

Generally, Non-Return-to-Zero-Inverse (hereinafter NRZI) code shows that no change is in magnetic flux of a record medium if the signal detected in the record medium is a binary number '0' and that the direction of magnetic flux recorded in the record medium is reversed if the signal detected in the record medium is a binary number '1' thus to record data in the record medium and detects or regenerate the recorded signal.

Recently, by the Run Length Limited (Hereinafter as RLL) code in which the concept of the NRZ code is expanded, a 8 bit data is modulated to a 16 bit data and the modulated code word is recorded in a record medium. At this time, the code word should satisfy these two restriction conditions. X The first restriction condition is that among bits having consecutive 1s, at least a bit having '0' value bit should exist. For instance, a data bit becomes three times as large as a data record density stored without a specific condition and accordingly, the data is recorded in the record medium with a high record density. At this time, on the first restriction condition, the data recorded in the record medium should be positioned in the distance so that the magnetic flux polarity of the data bit can be sorted even though the data is recorded in the record medium with a high record density. Namely, the first restriction condition is that bits having a certain '0' bit value in the record medium are recorded and symbols do not intervene each other when the recorded data is regenerated.

Also, the second restriction condition is that the numbers of bits having 0 value bits should not be many among the bits having consecutive 1 value bits. If the bits which have 0 value are not spread but is formed in a stream, the clock which generates a phase lock circuit is not motivated. Therefore, clock signals can be restored from the regenerated data by locking the phase lock circuit in the position where transition of the regenerated data is performed.

However, the data stream modulated satisfying the restriction conditions generally includes DC component. If the data stream in which the DC component is not removed is recorded in the record medium, when the data stream is regenerated, error signals such as tracking errors of the record medium are generated and accordingly, normal output of regeneration data can not be performed. Namely, the DC composition signals interrupt the recorded digital signals from dealing with low frequency components normally. By removing the low frequency components, consecutive tracking controlling is enabled and accordingly when the data recorded in the record medium is detected through the optical recording carrier, the recorded data can be normally regenerated. Therefore, if the low frequency components are controlled properly, tracking controlling of the record medium is capable of not being influenced on the low frequency components.

Therefore, to solve the problems that the DC components are included in the modulated data, the Digital Sum Value (hereinafter as DSV) of modulated data stream controlling technique is developed. Here, the DSV, for example, in case of using NRZI modulating method, is obtained by modulating the m units of source words into n units of channel words and adding up the channel words. At this time, the NRZI modulating method allocates a binary number '0' bit of the channel words to −1 value and a binary number '1' bit is allocated to a '+1' value. Therefore, a digital data stream having a small DSV becomes a digital data stream containing small amount of DC component.

The method for controlling the DSV of digital data stream in accordance with the conventional art is described as follows.

Figure 1A:
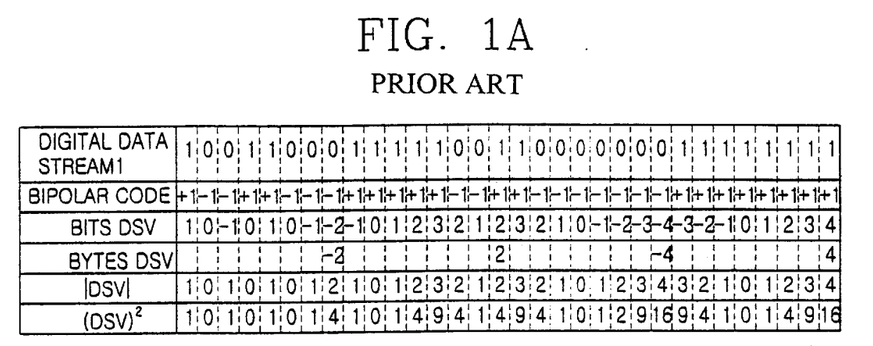
FIGS. 1a and 1b are tables showing the first and second data stream for describing the method to determine a digital data stream according to the conventional art.
Figure 1B:
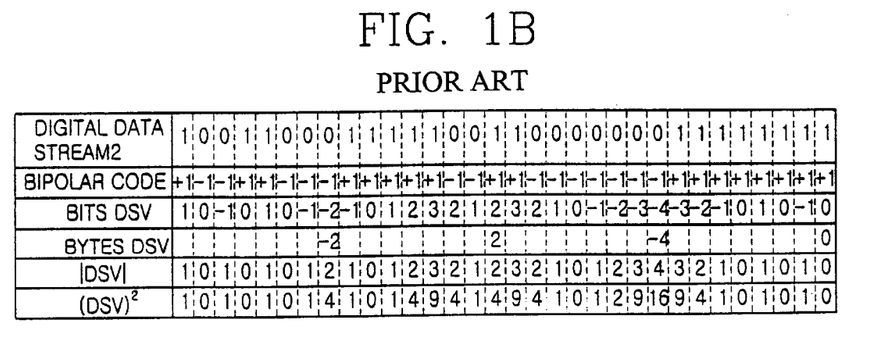

FIG. 1a and FIG. 1b are tables showing the first and second digital data stream to describe the method on how to determine a digital data stream according to the conventional art and each table includes a bipolar code stream obtained from each bit of the first and second digital data stream, the DSV obtained from the bipolar code stream and an absolute value of the DSV and the squared value of the DSV obtained from the DSV.

(1) Method Using the Value of DSV

For example, in case of comparing the DSV value of each of the first and second data stream for 4 bites, as shown in FIG. 1a, the DSV of the first digital data stream is 4 and as shown FIG. 1b, the DSV of the second digital data stream is 0. Therefore, the second digital data stream is determined as a code word since the small DSV of the second digital data stream is fit to the data stream condition having a small DC component.

(2) Method Using the Absolute Value of DSV

In case of comparing the absolute value of the DSV for 4 bites, as shown in FIG. 1a, the absolute value of the DSV of the first digital data stream is 50 1+0+1+0+, . . . , +2+3+4), and as shown in FIG. 1b, the absolute value of the DSV of the second digital data stream is 39 (1+0+1+0, . . . , +0+1+0). Accordingly the second digital data stream is determined as a code word since the small DSV of the second digital data stream fits the data stream condition having a small DC component.

(3) Method Using Squared Value of DSV

In case of comparing the squared value of the DSV for 4 bites, as shown in FIG. 1a, the squared value of the DSV of the first digital data stream is 118 (1+0+1+0+, . . . , +4+9+16), and as shown in FIG. 1b, the squared value of the DSV of the second digital data stream is 92 (1+0+1+0, . . . , +0+1+0). Accordingly, the second digital data stream is determined as a code word since the small DSV of the second digital data stream fits the data stream condition having a small DC component.

(4) Method Using Critical Value of DSV (a Method Thereby for Determining a Digital Data Stream with a Small DC Component as the Code Word According to the Number of the DSV Larger Than the Level of a Certain Critical Value)

Figure 2A:
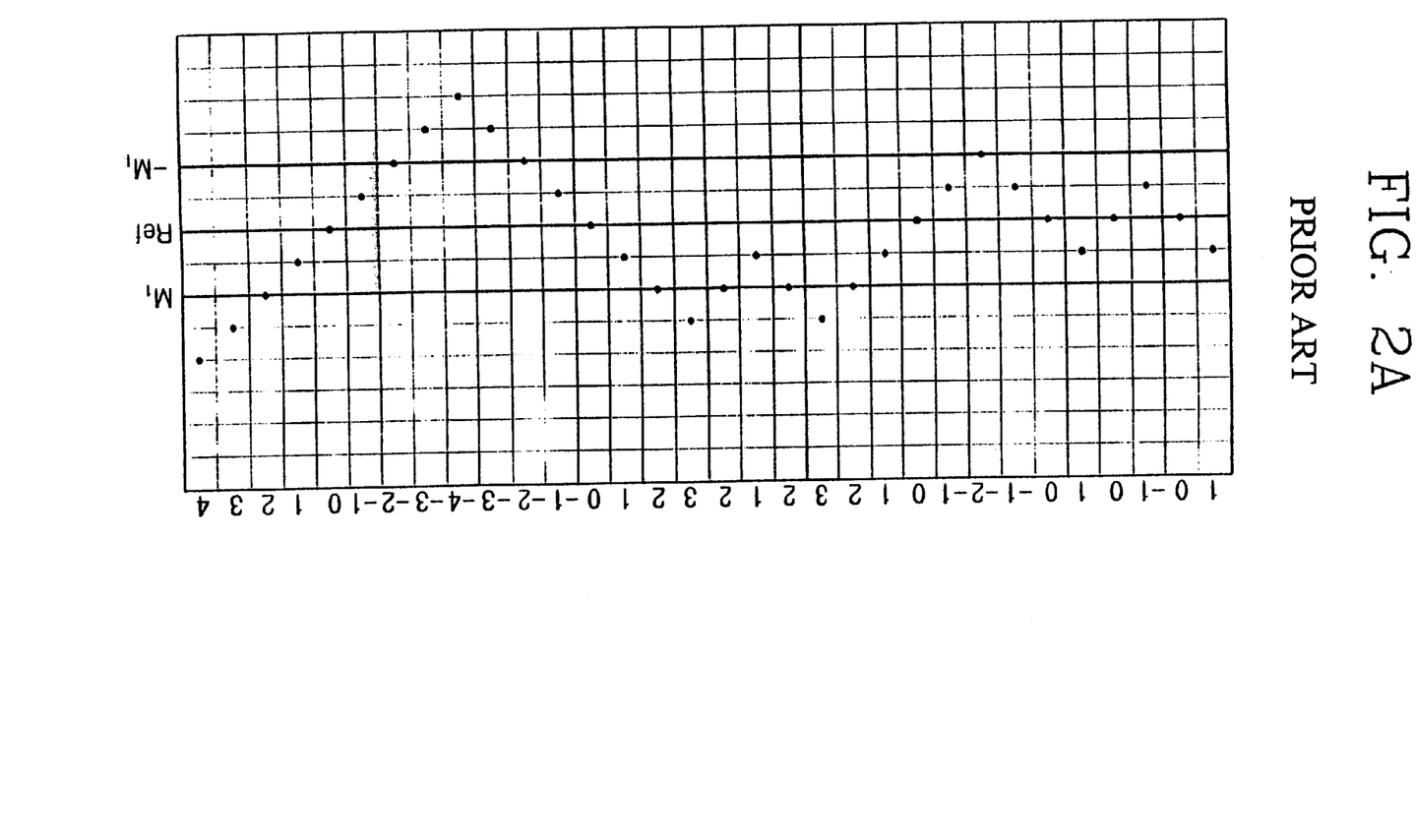
FIGS. 2a and 2b are graphs showing the size of the DSV in FIGS. 1a and 1b in accordance with the conventional art.
Figure 2B:
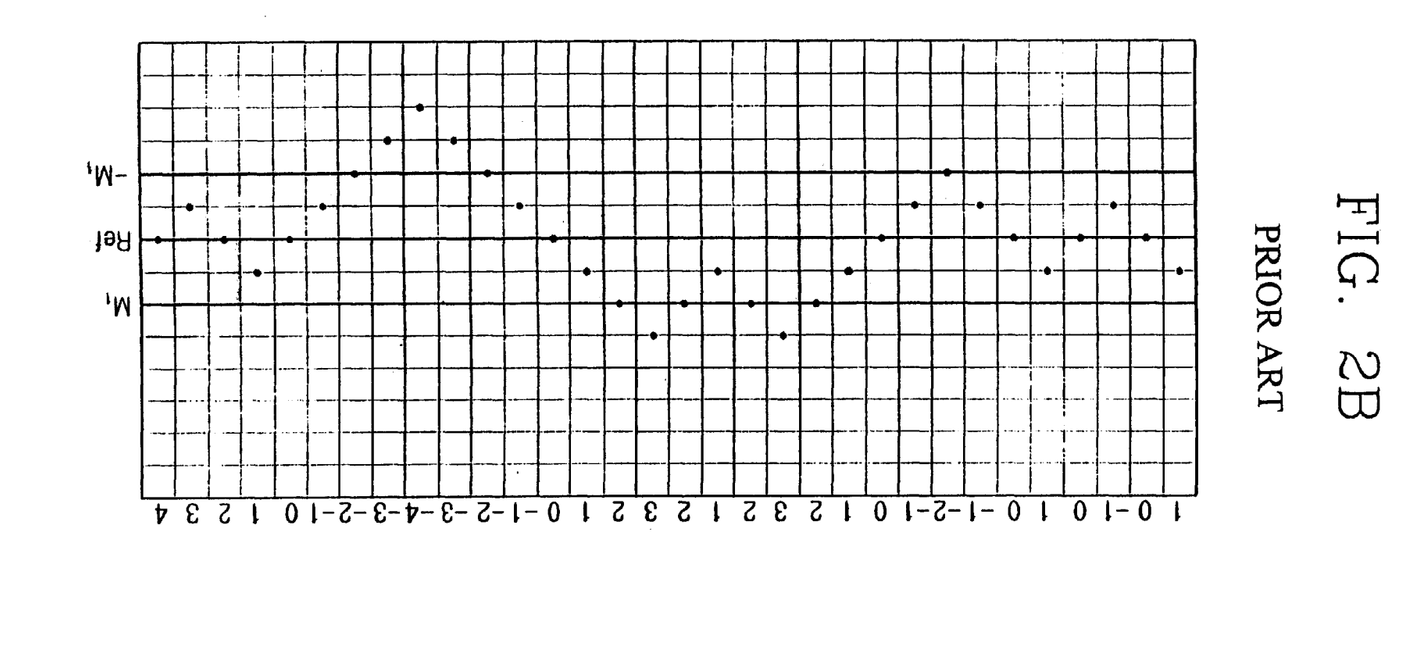

FIG. 2a and FIG. 2b are graphs showing each size of the DSV of the FIG. 1a and FIG. 1b according to the conventional art. For example, the number of the DSV having a bigger value than the level of M=|−M|=2 as shown in FIG. 2a, for the first digital data stream is 15 times, and for the second digital data stream is 12. Therefore, the second digital data stream having a small number of the DSV which are larger than a certain critical level is determined as a code word.

It is described that the conventional modulating method for a digital data stream determines by using the DSV calculated in terms of bit, the absolute value of the DSV and the squared value of the DSV. However, actually, the digital data stream is determined by using the calculated value in terms of bite or word.

However, the conventional data modulating methods described above have a disadvantage that the circuit is large and accordingly, the composition of the hardware is very complicated and the efficiency is not good compared to the size of the circuit since many multipliers are necessary to select the second digital data stream when it is realized in the form of hardware.

On the other hand, to reduce the influence of noise such as the DC component, there is a modulating method of maintaining the DSV by adding a merging bit to the source data stream, but the method has a disadvantage of reducing modulating efficiency of the source data stream and of reducing record density.

SUMMARY OF THE INVENTION

One object of the present invention is to provide a method for modulating digital data and apparatus therefor for determining the digital data stream having the minimum DSV swiftly and precisely.

Another object of the present invention is to provide a method for modulating digital data and apparatus therefor for determining the digital data stream having the minimum DSV using weight values corresponding to the DSV and preset critical value swiftly and precisely.

To achieve these and other objects, the digital data modulating method in accordance with an embodiment of the present invention includes the steps of: comparing a preset critical value and DSV of a certain digital data stream; computing the penalty of the digital data stream by multiplying the number of the time that the DSV of the digital data stream is larger than the critical value by a preset weight value of the critical value; and comparing the penalty of the digital data and a penalty of another digital data stream and determining a digital data stream with a smaller penalty for the digital data stream.

The apparatus for modulating digital data according to an embodiment of the present invention includes: a DSV calculating unit for computing DSV of the inputted digital data; a DSV lever detector for outputting the weight value corresponding to the critical values comparing the DSV and the preset critical value; and a penalty generating unit for generating a penalty of the digital data stream using the DSV detected by the level detector.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 3:
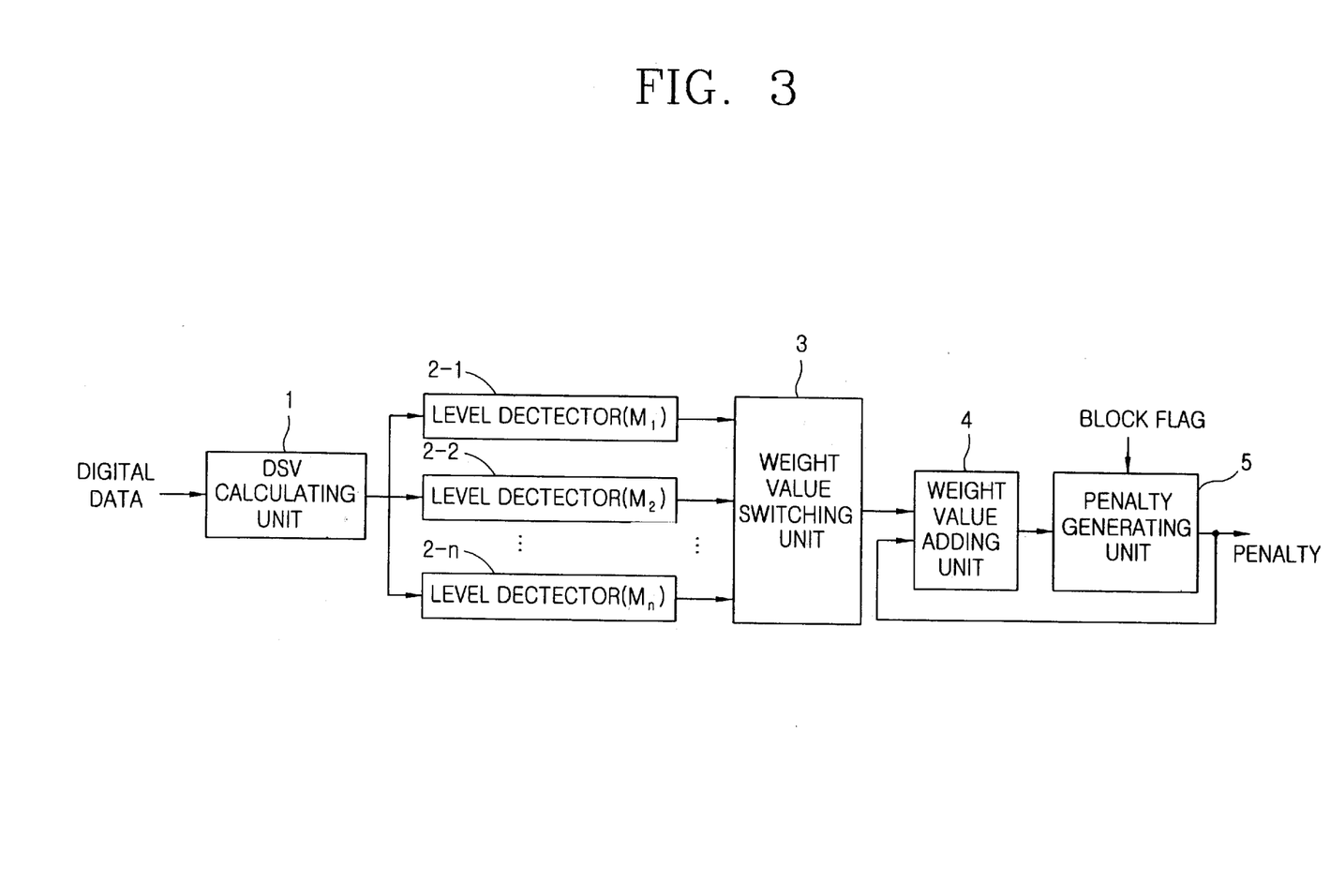
FIG. 3 is a block diagram showing an apparatus for modulating digital data stream(s) in accordance with an embodiment of the present invention.

FIG. 3 is a block diagram showing an apparatus for modulating digital data stream(s) in accordance with an embodiment of the present invention and the apparatus for modulating digital data includes: a DSV calculating unit 1 for computing DSV of the inputted digital data; a plurality of level detectors 2-1, 2-2, . . . , and 2-n for outputting the weight value corresponding to the DSV; a weight value switching unit 3 for outputting only the weight values detected by the level detectors 2-1, 2-2, . . . , and 2-n ; a weight value adder 4 for adding the outputted weight values; and a penalty generating unit 5 for generating a penalty of the digital data stream using the added weight value and a data block flag. All these components are operatively coupled.

The operation of the apparatus for modulating digital data stream(s) in accordance with an embodiment of the present invention will be described.

Figure 4:
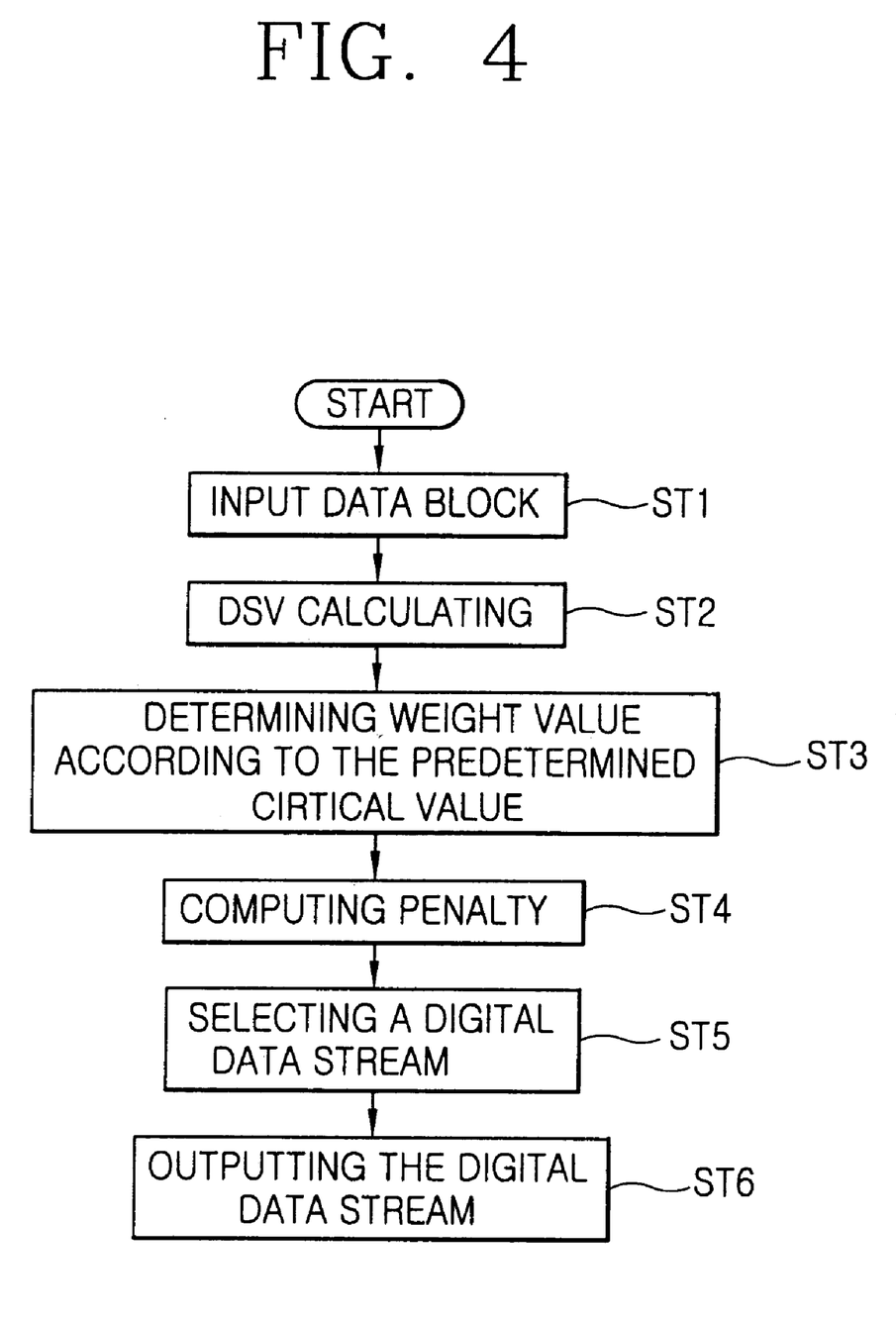
FIG. 4 is a flow chart showing a method for modulating digital data stream(s) in accordance with an embodiment of the present invention.

FIG. 4 is a flow chart showing the method for modulating digital data stream(s) in accordance with an embodiment of the present invention. The first step ST1 is to receive a digital data stream. For example, after executing a Non-Return-to-Zero-Inverse(NRZI) coding, a DSV of the coded digital data stream is calculated. The second step ST2 is, for example, to perform NRZI coding and then compute the DSV of the coded digital data stream. The third step ST3 is to determine weight values from the critical values of a number of preset levels corresponding to the computed DSV. The fourth step ST4 is to compute the penalty by multiplying the weight value by the levels. The fifth step ST5 and sixth step ST6 are to select and output a digital data stream having smaller penalty by comparing different digital data streams from the above described digital data streams.

The methods for selecting the digital data stream according to the embodiments of the present invention will be described here in detail.

Figure 5A:
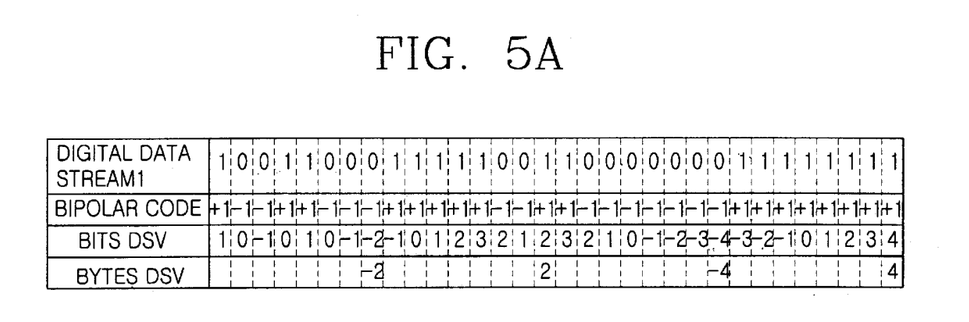
FIGS. 5a and 5b are tables showing the first and second digital data stream for describing how to determine the digital data stream in accordance with an embodiment of the present invention.
Figure 5B:
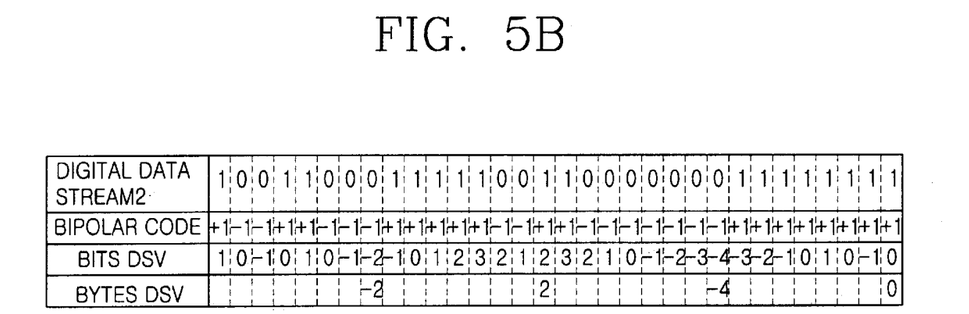

(1) Method for Selecting a Digital Data Stream Using a Pair of Critical Value Levels and the Corresponding Weight Values:

FIGS. 5a and 5b are tables showing examples of the first and second digital data stream for describing a method for modulating a digital data stream in accordance with an embodiment of the present invention. The tables contain bipolar code streams from the first and second digital data streams and the DSV obtained from the bipolar code streams.

Figure 6A:
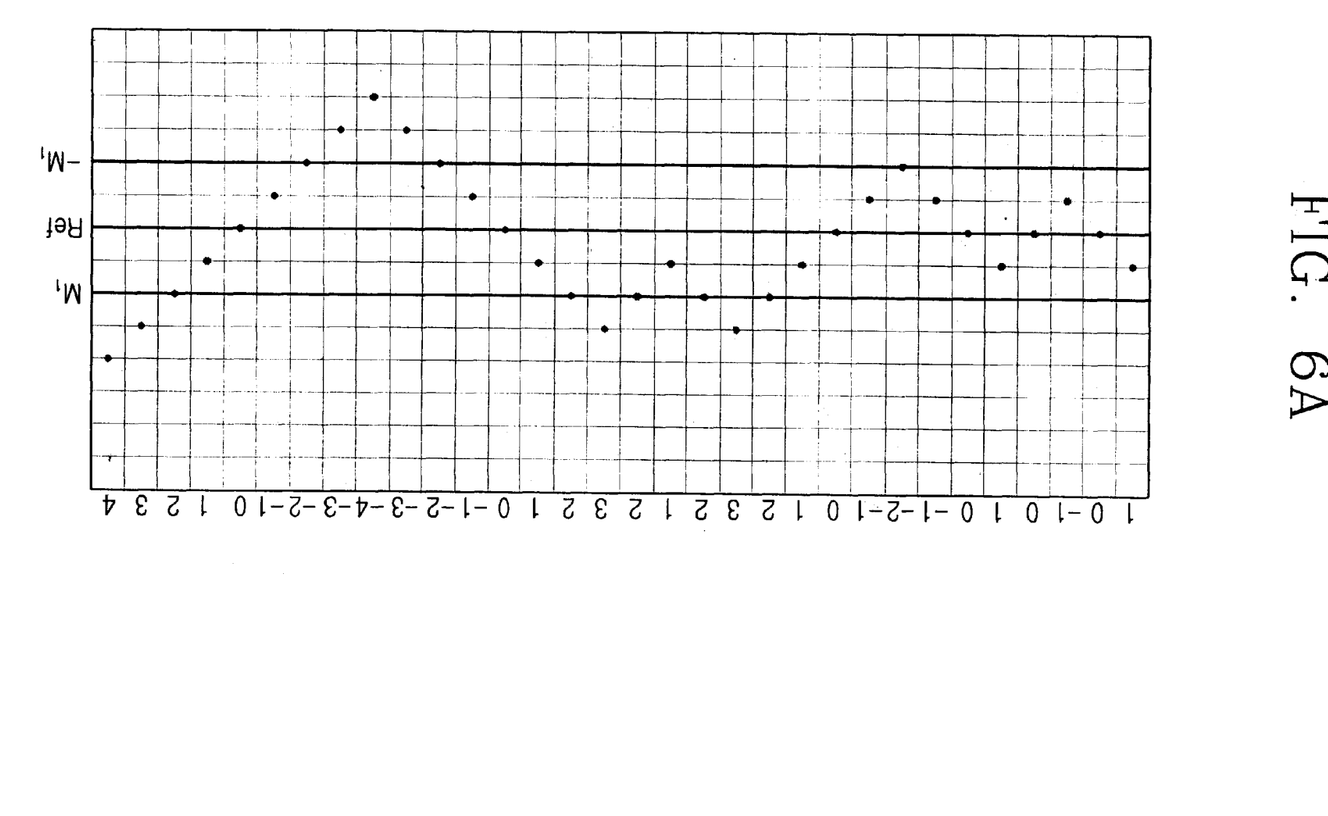
FIGS. 6a and 6b are graphs showing the size of the DSV of a pair of critical values in FIGS. 5a and 5b according to an embodiment of the present invention.
Figure 6B:
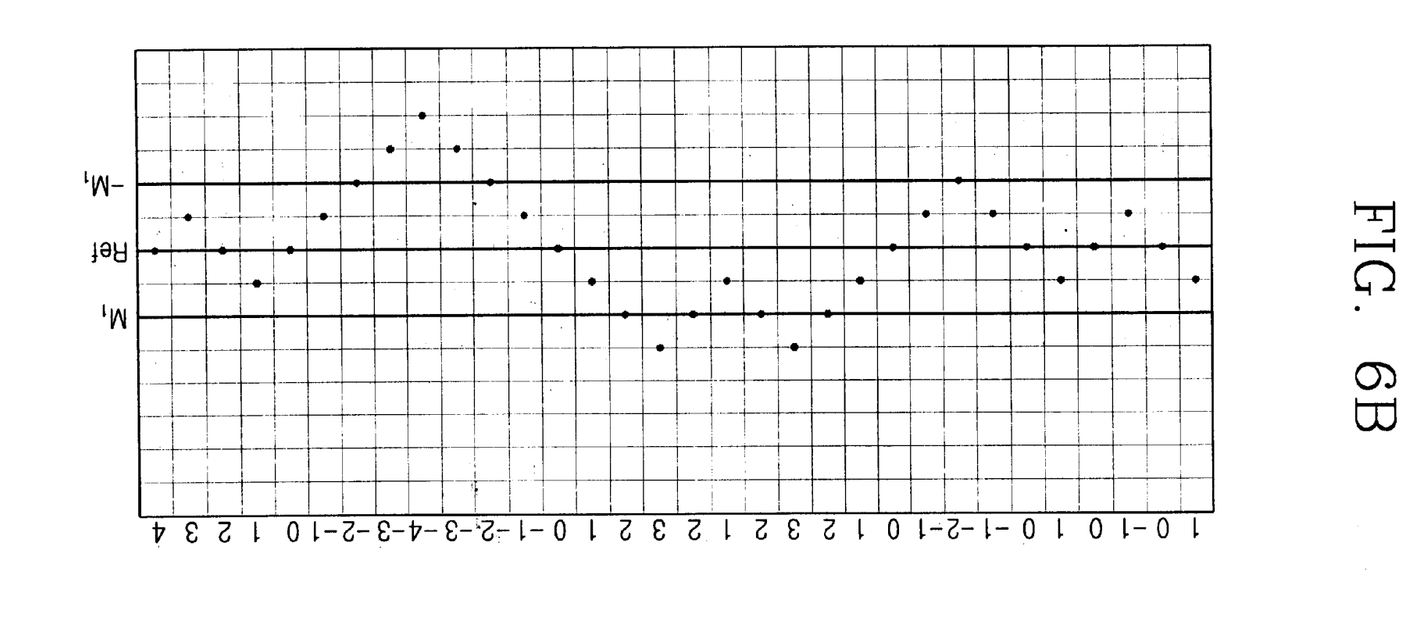

FIGS. 6a and 6b are examples of graphs showing the size of the DSV of a pair of critical values in FIGS. 5a and 5b according to the present invention and the DSV of the digital data stream corresponding to the pair of critical levels M1 and M2 set centering around the DSV of '0' is marked in the graph. At this time, to DSV smaller than the absolute value of the critical value(for example, 2), weight value of '0' is allocated and to larger DSV, weight value of '2' is allocated. Accordingly, a digital data stream having smaller DSV among a plurality of digital data streams is determined precisely and swiftly by imposing penalty to the bits out of the critical value level. Therefore, the penalty P of a digital data stream, as shown in the following equation 1, is obtained precisely and swiftly by adding weight values of the bits out of the critical value level.

$$P = \sum_{i=0}^{n} V_i \cdot W_i \quad (1)$$

Here, $V_i$ indicates the number of data larger than the critical value and $W_i$ indicates the correspond weight value.

The penalty of the first digital data stream is 28 since $V_i$ is 14. Also, the penalty of the second digital data stream is 22 since $V_i$ is 11. Therefore, the first digital data having a smaller DSV stream is selected.

Figure 7A:
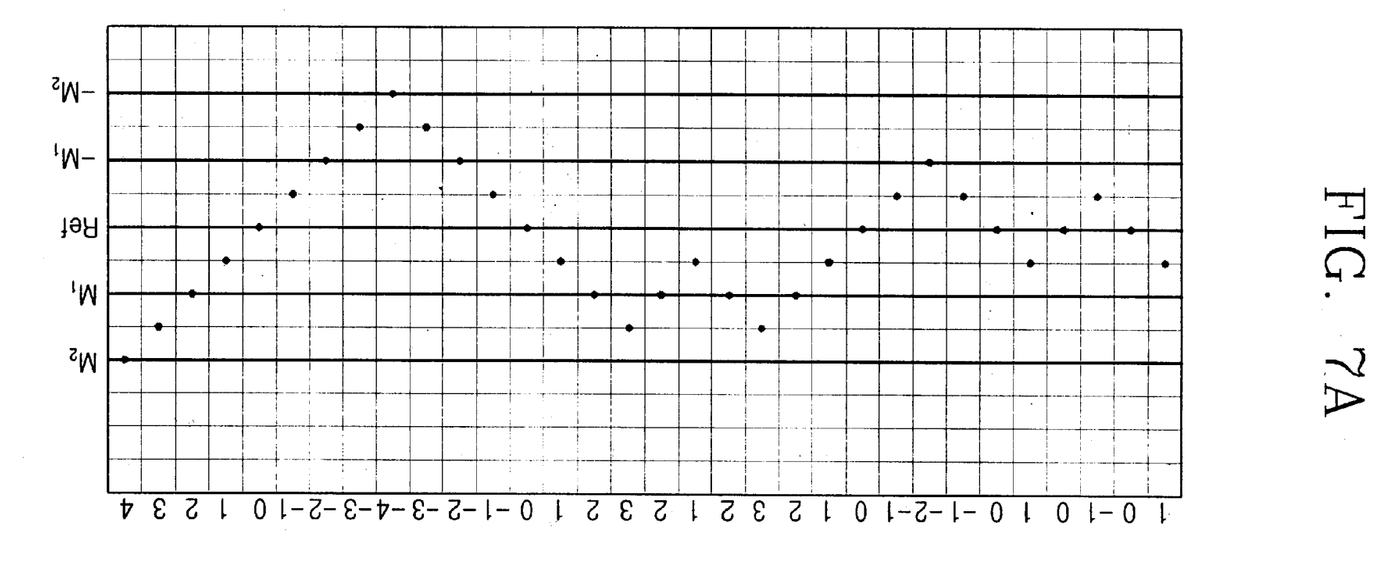
FIGS. 7a and 7b are graphs showing the size of DSV of a plurality of critical values in FIGS. 5a and 5b according to an embodiment of the present invention.
Figure 7B:
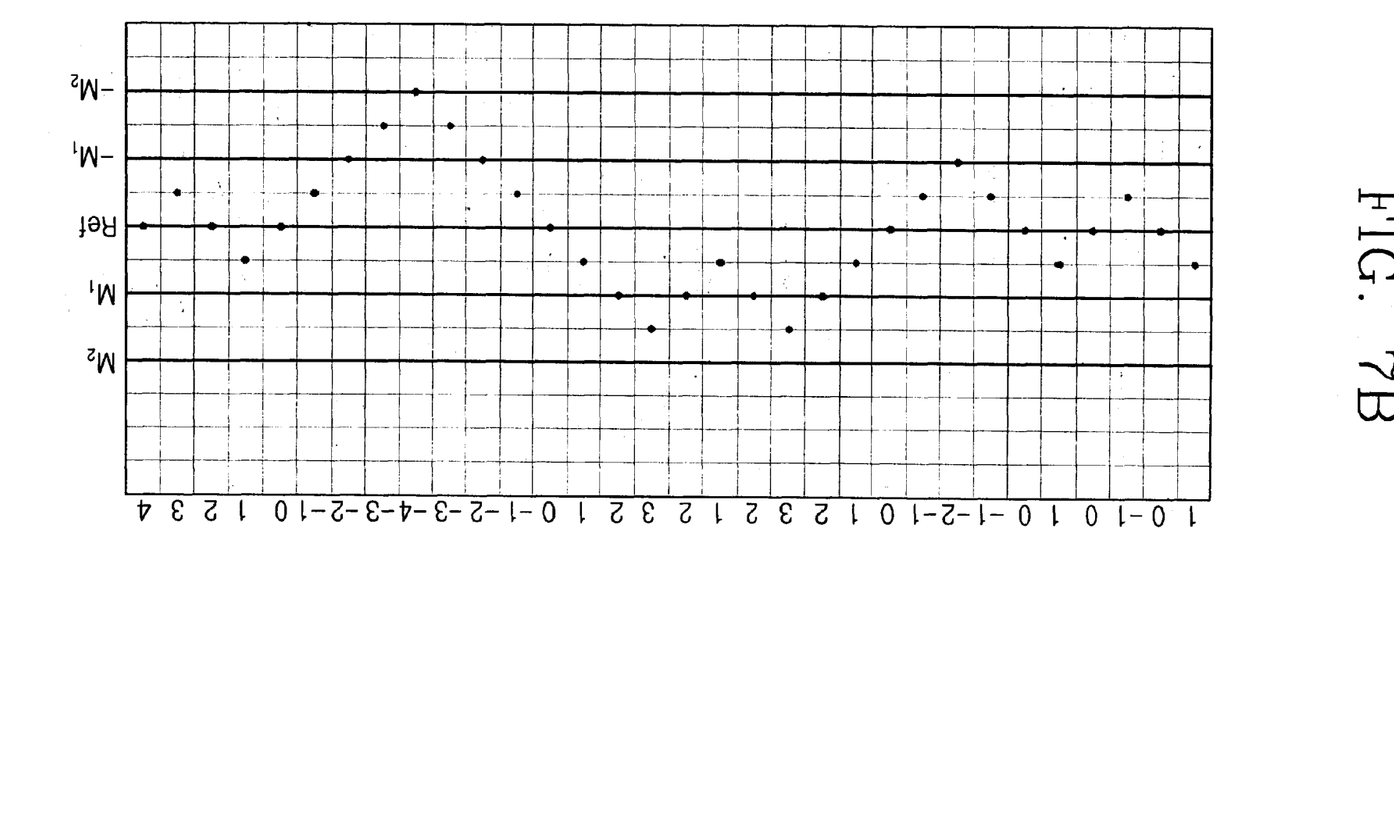

(2) Method for Selecting a Digital Data Stream Using Multiple Critical Levels and the Correspond Weight Values:

FIGS. 7a and 7b are examples of graphs showing the size of DSV of a plurality of critical values in FIGS. 5a and 5b according to the present invention and the DSV of the digital data stream according to the multiple critical value levels M1, M2, . . . , –M2, . . . centering around the DSV of '0' is indicated in the graph. At this time, values such as 0, 1, 2, . . . can be allocated to the weight values W1, W2, . . . of the critical values. Therefore, the penalty P of the digital data stream having a value out of the DSV of '0' is obtained by the equation 2.

$$P = \sum_{i=0}^{n} V_{th-i} \cdot W_{th-i} \quad (2)$$

$V_{th-i}$ indicates the number of data which is larger than the critical value of $V_{th}$, and $W_{th-i}$ is the weight value allotted to the critical value of $V_{th}$.

The penalty P of the first digital data stream is 17 (=20×0+11×1+2×2). Namely, the number of bits between 0 and M1 is 17 and the weight value is 0. Also, the number of bits of M1, larger than M1 and smaller than M2 is 13 and the weight value is 2.

The penalty P of the second digital data stream is 13 (=20×0+11×1+1×2). Namely, the number of bits between 0 and M1 is 20 and the weight value is 0. Also, the number of bits of M1, and between M1 and M2 is 11 and the weight value is 1. The number of bits larger than M2 is 1 and the weight value is 2.

Therefore, the second digital data stream is selected as a code word since the penalty P of the digital data stream divides the size of the DSV of the digital data stream precisely.

Figure 8A:
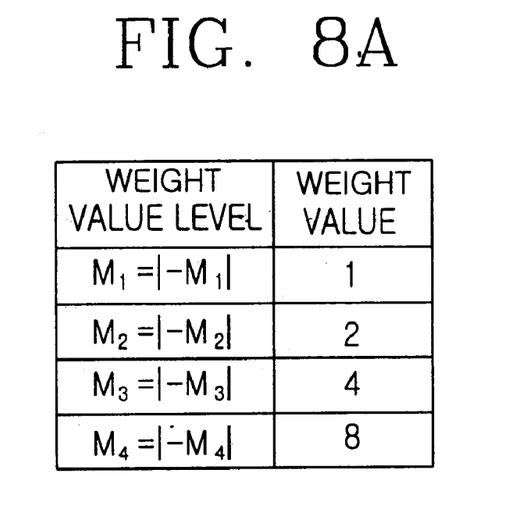
FIG. 8a is a table showing a case in which each pair of weight values allocated to a plurality of critical values centering around the DSV of '0' have same value symmetrically.
Figure 8B:
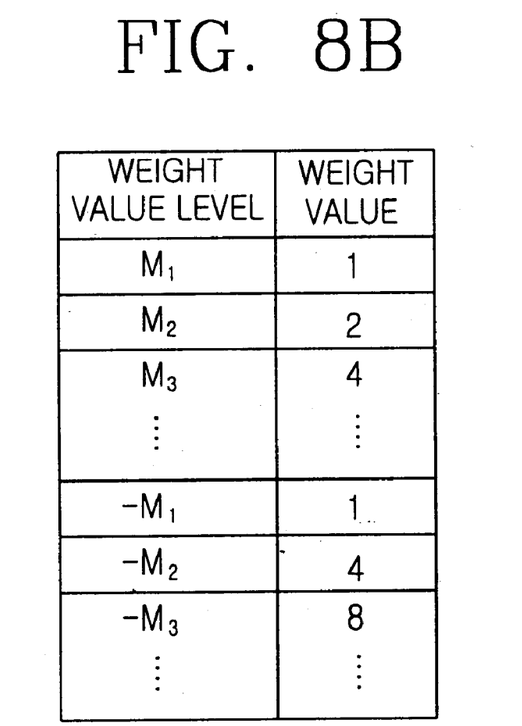
FIG. 8b is a table showing the case in which the weight values allocated to upper critical values and those of lower critical values centering around the DSV of '0' are different each other.

On the other hand, each pair of critical values centering around the DSV of '0' have the same critical values and as shown in FIG. 8a, the corresponding weight values are allocated to be the same. However, without setting the same critical values and weight values symmetrically, the penalty of the digital data stream can be obtained (FIG. 8b). Namely, FIG. 8a is an example of a table showing a case in which each pair of weight values allocated to a plurality of critical values centering around the DSV of '0' have the same value symmetrically. FIG. 8b is an example of a table showing the case in which the weight values allocated to upper critical values and those of lower critical values centering around the DSV of '0' are different each other.

The method for modulating digital data and apparatus therefor in accordance with the present invention is described in that the digital data stream is determined using the DSV computed in bits. However, the digital data stream is determined using the DSV calculated in bites or words actually.

Also, the weight values corresponding to the levels are allocated to the multiplier of 2, but other multipliers can be allocated.

The DSV calculating unit additionally includes an absolute value processing unit since it uses absolute values in case that the levels of DSV are set symmetrically.

Also, the method for modulating a digital data stream can be applied to EFM plus and guided scrambling methods, and other suitable devices and/or methods.

The method for modulating digital data and apparatus therefor in accordance with the present invention can select a digital data stream which will be modulated among a number of digital data streams precisely and swiftly by obtaining penalty using the DSV and corresponding weight value among inputted digital data streams. Also it can reduce complexity of hardware, simplify the system and reduce cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digital data modulating method comprising the steps of:
    comparing a preset critical value and a digital sum value (DSV) of a certain digital data stream;
    computing a penalty of the digital data stream by multiplying the number of times that the DSV of the digital data stream is larger than the critical value by a preset weight value corresponding to the critical value; and
    comparing the penalty of the digital data stream and a penalty of another digital data stream to determine a digital data stream with a smaller penalty.

2. The method of claim 1, wherein said preset critical values are plural.

3. The method of claim 2, wherein a different weight value is allocated to each of the critical values.

4. The method of claim 2, wherein the weight value increases in proportion to an increase in the critical values.

5. The method of claim 2, wherein the weight value increases by a multiplier of 2 corresponding to the critical values.

6. The method of claim 1, wherein the preset critical values have a different polarity.

7. The method of claim 1, wherein the step of comparing the DSV is performed in terms of bit or byte or word included in the digital data stream.

8. The method of claim 1, wherein the number of the critical values is two; and the penalty is obtained by an equation of $$P = \sum_{i=0}^{n} V_i \cdot W_i;$$

of which Vi indicates the number of data which is larger than the critical value, and $W_i$ indicates a weight value thereof.

9. The method of claim 8, wherein the preset critical values have different absolute values and different polarities.

10. The method of claim 8, wherein the preset critical values are set as a pair having same absolute values and different polarities.

11. The method of claim 1, wherein the number of the critical values is larger than two; and the penalty is obtained by an equation of $$P = \sum_{i=0}^{n} V_{th-i} \cdot W_{th-i};$$

of which $V_{th-i}$ indicates the number of data which is larger than the critical value, and $W_{th-i}$ indicates a weight value allotted thereto.

12. The method of claim 11, wherein the preset critical values have different absolute values and different polarities.

13. The method of claim 11, wherein the preset critical values are set as pairs each having same absolute values and different polarities.

14. A digital data modulating apparatus comprising:
- a digital sum value (DSV) computing unit computing a DSV of an inputted digital data stream;
- a DSV level detector comparing the DSV and a preset critical value and outputting a weight value corresponding to the critical value; and
- a penalty generating unit generating a penalty of the digital data stream by using the DSV and the weight value detected by the DSV level detector.

15. The apparatus of claim 14, wherein the DSV level detector includes:
- a plurality of level detectors outputting the weight values corresponding to the DSV;
- a weight value switching unit outputting the outputted weight values; and
- a weight value adder adding the outputted weight values.

16. The apparatus of claim 14, wherein the penalty generating unit generates the penalty of the digital data stream by multiplying the number of times that the DSV of the digital data stream is larger than the critical value by the weight value.

17. The apparatus of claim 14, wherein the number of the critical values is two; and the penalty is obtained by an equation of $$P = \sum_{i=0}^{n} V_i \cdot W_i;$$

of which $V_i$ indicates the number of data which is larger than the critical value, and $W_i$ indicates a weight value thereof.

18. The apparatus of claim 17, wherein the preset critical values have different absolute values and different polarities.

19. The apparatus of claim 17, wherein the preset critical values are set as a pair having same absolute values and different polarities.

20. The apparatus of claim 14, wherein the number of the critical values is larger than two; and the penalty is obtained by an equation of $$P = \sum_{i=0}^{n} V_{th-i} \cdot W_{th-i};$$

of which $V_{th-1}$ indicates the number of data which is larger than the critical value, and $W_{th-i}$ indicates a weight value allotted thereto.

21. The apparatus of claim 20, wherein the preset critical values have different absolute values and different polarities.

22. The apparatus of claim 20, wherein the preset critical values are set as pairs each having same absolute values and different polarities.

* * * * *